(12) United States Patent
DeCruyenaere et al.

(10) Patent No.: US 7,711,078 B2
(45) Date of Patent: May 4, 2010

(54) FREQUENCY SYNCHRONIZATION

(75) Inventors: Jean-Paul DeCruyenaere, Ottawa (CA); Ralph Mason, Ottawa (CA); Anita Netherton, Ottawa (CA)

(73) Assignee: SMSC Holdings SARL, Luxembourg (LU)

( * ) Notice: Subject to any disclaimer, the term of this patent is extended or adjusted under 35 U.S.C. 154(b) by 549 days.

(21) Appl. No.: 11/809,796

(22) Filed: Jun. 1, 2007

(65) Prior Publication Data
US 2008/0298533 A1  Dec. 4, 2008

(51) Int. Cl.
*H03D 3/24* (2006.01)
(52) U.S. Cl. .................. 375/376; 375/327
(58) Field of Classification Search ........ 375/327, 375/215, 294, 354, 364, 373, 376; 370/395.62, 370/503; 327/145, 147, 160, 48; 455/265, 455/180.3, 266, 267; 702/89; 342/103
See application file for complete search history.

(56) References Cited

U.S. PATENT DOCUMENTS

| | | | |
|---|---|---|---|
| 5,394,444 A * | 2/1995 | Silvey et al. | 375/374 |
| 5,483,558 A * | 1/1996 | Leon et al. | 375/376 |
| 6,268,780 B1 * | 7/2001 | Olgaard et al. | 332/117 |
| 6,790,116 B2 | 9/2004 | Inahashi | |
| 7,260,126 B2 * | 8/2007 | Wang et al. | 372/30 |
| 7,362,185 B1 * | 4/2008 | Yildiz et al. | 331/17 |
| 7,567,099 B2 * | 7/2009 | Edwards et al. | 327/145 |
| 2004/0017234 A1 * | 1/2004 | Tam et al. | 327/141 |

FOREIGN PATENT DOCUMENTS

| | | |
|---|---|---|
| CA | 1198170 | 12/1995 |
| EP | 0 747 803 B1 | 12/1996 |
| JP | 60037857 | 2/1985 |
| JP | 63156449 | 6/1988 |
| JP | 2003023352 | 1/2003 |

* cited by examiner

*Primary Examiner*—Chieh M Fan
*Assistant Examiner*—Aristocratis Fotakis
(74) *Attorney, Agent, or Firm*—Valauskas & Pine LLC

(57) ABSTRACT

Systems and methods related to digital frequency locked looping to synchronize frequencies between the local signal from a local oscillator and a reference clock signal from a remote oscillator. A reference counter increments its count for every pulse in the reference clock signal. The value in the reference counter is compared to a configurable reference value. Whenever a match between the reference counter value and the reference value occurs, a hit signal is generated and the reference counter value is reinitialized. Concurrent with the above, a feedback counter increments for every pulse from the local signal. When the hit signal is generated, the value in the feedback counter is compared to a configurable feedback value (by subtraction) to generate a difference value. The difference value is then converted to a frequency adjust signal for use in either increasing or decreasing the frequency of the local oscillator. The hit signal also reinitializes the feedback counter.

19 Claims, 7 Drawing Sheets

FREQUENCY SYNCHRONIZATION

FIELD OF THE INVENTION

The present invention relates to digital electronics. More specifically, the present invention relates to methods and systems for frequency synchronizing one oscillator producing one clock signal with another oscillator producing another clock signal.

BACKGROUND OF THE INVENTION

The revolution in digital electronics and communications has given rise to a multitude of digital devices for the consumer. Digital music players and cellular telephone handsets are just two results from this revolution. For some of these devices, the clock signals which run their digital electronics components may need to be synchronized. As an example, to ensure that device A properly works with device B, their clock signals may need to be frequency synchronized with one another.

While clock synchronization may be possible using a phase locked loop (PLL), this approach requires complex signal processing and is unsuitable for low power applications. Furthermore, phase locked loops are not necessarily able to adjust to changing conditions. Inexpensive PLLs may be unable to adjust if one of the clock signals it is tracking drifts from its expected frequency. A PLL is also quite more than what is needed in some applications which may only require frequency tracking and not necessarily phase tracking between two signals.

There is therefore a need for frequency locked looping suitable for use with digital electronics that does not require complex signal processing and that is simple to implement. It would also be preferable if such a solution were also suitable for use in synchronizing clock signals across a wireless link. Preferably, the solution would be able to adjust the frequency of a VCO (voltage controlled oscillator).

SUMMARY OF THE INVENTION

The present invention provides for systems and methods related to digital frequency locked looping to synchronize frequencies between the local signal from a local oscillator and a reference clock signal from a remote oscillator. A reference counter increments its count for every pulse in the reference clock signal. The value in the reference counter is compared to a configurable reference value. Whenever a match between the reference counter value and the reference value occurs, a hit signal is generated. Concurrent with the above, a feedback counter increments for every pulse from the local signal. When the hit signal is generated, the value in the feedback counter is compared to a configurable feedback value (by subtraction) to generate a difference value. The difference value is then converted to a digital control signal for use in either increasing or decreasing the frequency of the local oscillator. The hit signal also reinitializes both the feedback counter and the reference counter.

In accordance with one aspect of the invention, there is provided a system for synchronizing a first frequency of a local clock signal with a second frequency of a reference clock signal, the system comprising:
  a reference counter block receiving said reference clock signal having said second frequency, said reference counter block incrementing a reference counter value upon receipt of each pulse of said reference clock signal, said reference counter block producing a hit signal indicative of whether said reference counter value equals a predetermined reference value, said hit signal reinitializing said reference counter value;
  feedback counter block for receiving said local clock signal and said hit signal, said feedback counter block incrementing a feedback counter value upon receipt of each pulse of said local clock signal to output a feedback count signal, said feedback count signal being a number of pulses of said local clock signal between receipts of said hit signal;
  an adder block for determining and producing a count error signal, said count error signal being a difference between said feedback count signal and a predetermined feedback value;
  a controller block for receiving said count error signal from said adder block and said hit signal, said controller block being triggered by a receipt of said hit signal, said controller block producing a frequency adjust signal based on said count error signal and said hit signal, said frequency adjust signal being for increasing or decreasing said first frequency.

In accordance with another aspect of the invention, there is provided a method for synchronizing frequencies between a reference clock signal having a first frequency and a local clock signal having a second frequency, the method comprising:
  receiving said reference clock signal
  incrementing a first counter for every pulse of said reference clock signal
  comparing a first counter value from said first counter with a predetermined reference value
  in the event said first counter value equals said reference value, generating a hit signal;
  concurrent with the previous steps, executing the following steps
    receiving said local clock signal
    incrementing a second counter for every pulse of said local clock signal
  in the event a hit signal is generated, executing the following steps:
    receiving a second counter value from said second counter
    performing a comparison of said second counter value with a predetermined feedback value
    generating a frequency adjust signal based on said comparison
  wherein
  said frequency adjust signal being for increasing or decreasing said second frequency
  said second counter is reset when said hit signal is generated.

BRIEF DESCRIPTION OF THE DRAWINGS

A better understanding of the invention will be obtained by considering the detailed description below, with reference to the following drawings in which.

DETAILED DESCRIPTION

Figure 1:
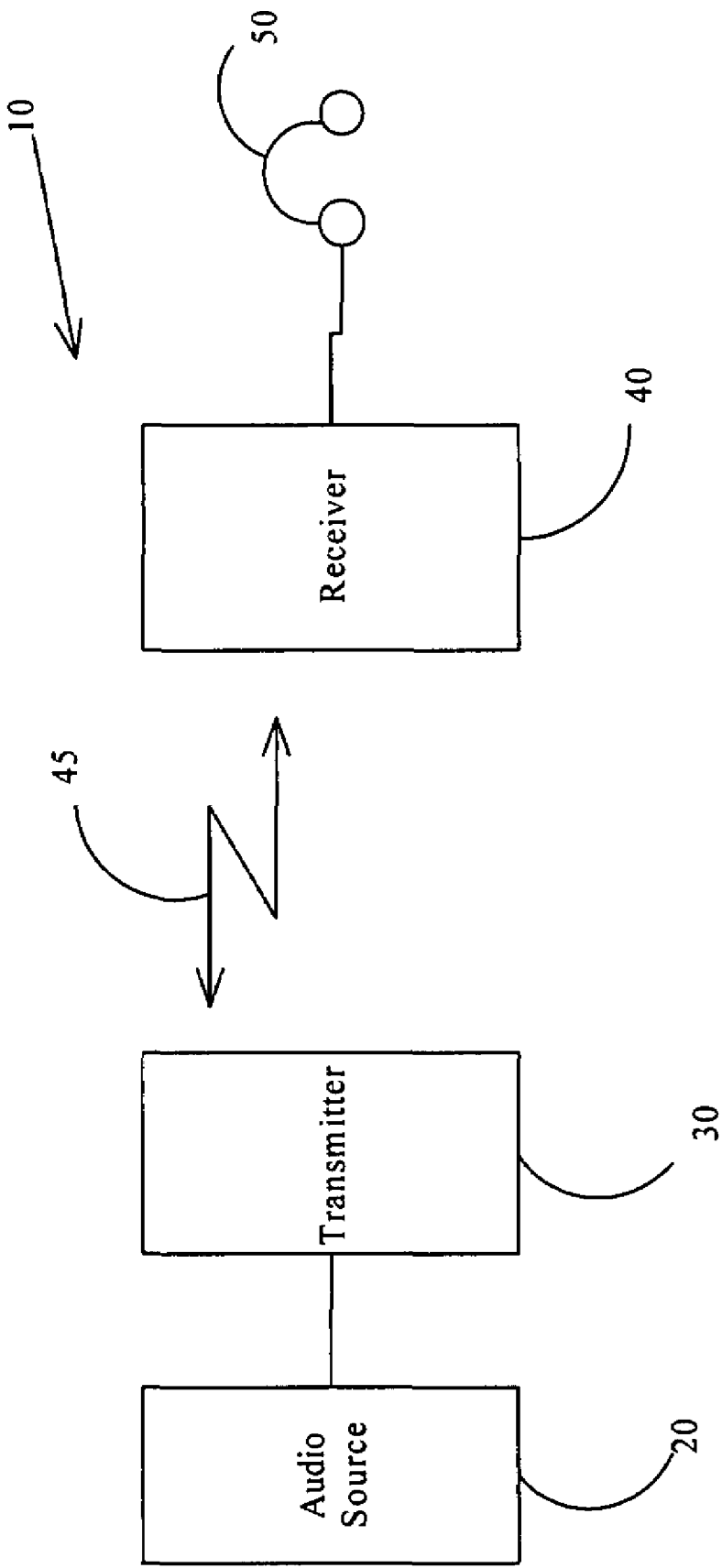
FIG. 1 is a block diagram of a receiver-transmitter system in which an embodiment of the invention may be used.

Referring to FIG. 1, a receiver-transmitter in which an embodiment of the invention may be used is illustrated. The system 10 has a multimedia data source 20, a transmitter 30, a receiver 40, and a multimedia destination 50. The data source may be a personal digital music player (commonly referred to as an MP3 player), a CD player, or any device which may be used to play or produce multimedia (such as audio or video) data signals. The transmitter 30 receives the multimedia data signals and transmits the data in regularly spaced and constant packets to the receiver 40. The transmission may be done through a wireless link 45. The receiver 40 then reconstitutes the multimedia data from the packets and sends the signals to the destination 50. In the figure, the destination 50 is illustrated as being headphones but other destinations for multimedia data (such as a stereo or other device) may be used.

For some implementations of the above receiver-transmitter system, it is necessary to frequency synchronize the clock signals of the data source 20 and of the transmitter 30. Also, these implementations may require that the frequencies of the clock signals for the receiver 40 and the transmitter 30 be synchronized as well. The wireless link can be used to frequency synchronize the clock signals of the receiver 40 and the transmitter 30 by having the transmitter 30 send evenly spaced packets to the receiver 40 at a constant rate (even if there is no data to be transmitted) that is related to the transmitter's clock signal. The receiver 40 can then use its rate of reception of the packets to determine the transmitter's clock signal frequency.

To frequency synchronize between the data source 20 and the transmitter 30, the transmitter receives the clock signal of the data source 20 through a hardwired connection and frequency synchronizes with this clock signal. Once frequency synchronized, the transmitter 30 can then frequency synchronize with the receiver 40.

It should be noted that the term "frequency synchronize", in the context of this document, means to synchronize the frequencies of two signals. As such, to frequency synchronize signals A and B means, if signal A has a frequency of A1, to ensure that signal B also has a frequency of A1. Ideally, frequency synchronization may also entail tracking the reference frequency and adjusting the local clock frequency to account for changes in the reference frequency. Frequency synchronization does not require phase synchronization. As such, if signals A and B are frequency synchronized to a frequency of A1, these signals may be out of phase with one another.

Figure 2:
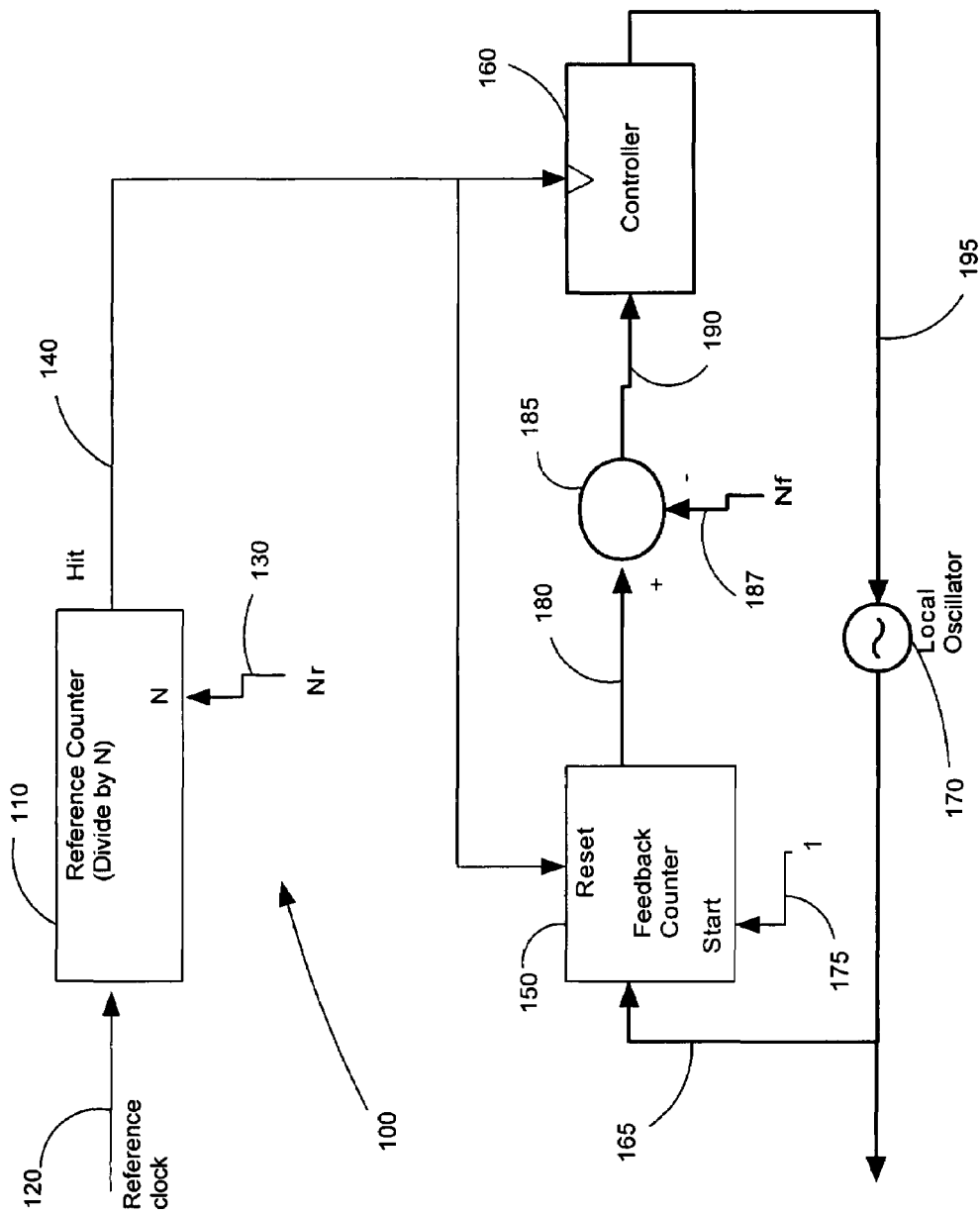
FIG. 2 is a block diagram of one embodiment of the invention.

Referring to FIG. 2, a block diagram of one embodiment of the invention is illustrated. FIG. 2 shows a block diagram of a frequency synchronization system 100 according to one aspect of the invention.

In the system 100, a reference counter block 110 receives a reference clock signal 120 and a reference value (Nr) 130. A hit signal 140 is produced by the reference counter every time the number of clock pulses of the reference clock signal 120 equals the number of the reference value 130. The hit signal is therefore produced whenever the counted clock pulses (the number of clock pulses which have elapsed since the last hit signal) equals the reference value 130. The hit signal reinitializes the reference counter whenever the hit signal is produced.

The hit signal 140 is received by a feedback counter block 150 as a reset signal and by a controller block 160. The feedback counter block 150 receives, as input, a local clock signal 165 from a local oscillator 170 and a start value 175. The feedback counter block 150 counts the number of pulses of the local clock between the instances of the hit signal 140.

The feedback counter block 150 outputs a feedback count signal 180 as the number of local clock signal pulses since the last hit signal. This feedback count signal 180 is then received by an adder 185. The adder 185 subtracts a feedback value (Nf) 187 from the feedback count signal 180 to result in a count error signal 190.

The count error signal 190 is received by the controller block 160. The controller block 160 uses the count error signal 190 to produce a frequency adjust signal 195 that adjusts the frequency of the local oscillator 170. Based on the frequency adjust signal 195, the frequency of the local oscillator is increased or decreased to synchronize this frequency with the frequency of the reference clock signal 120.

Figure 3:
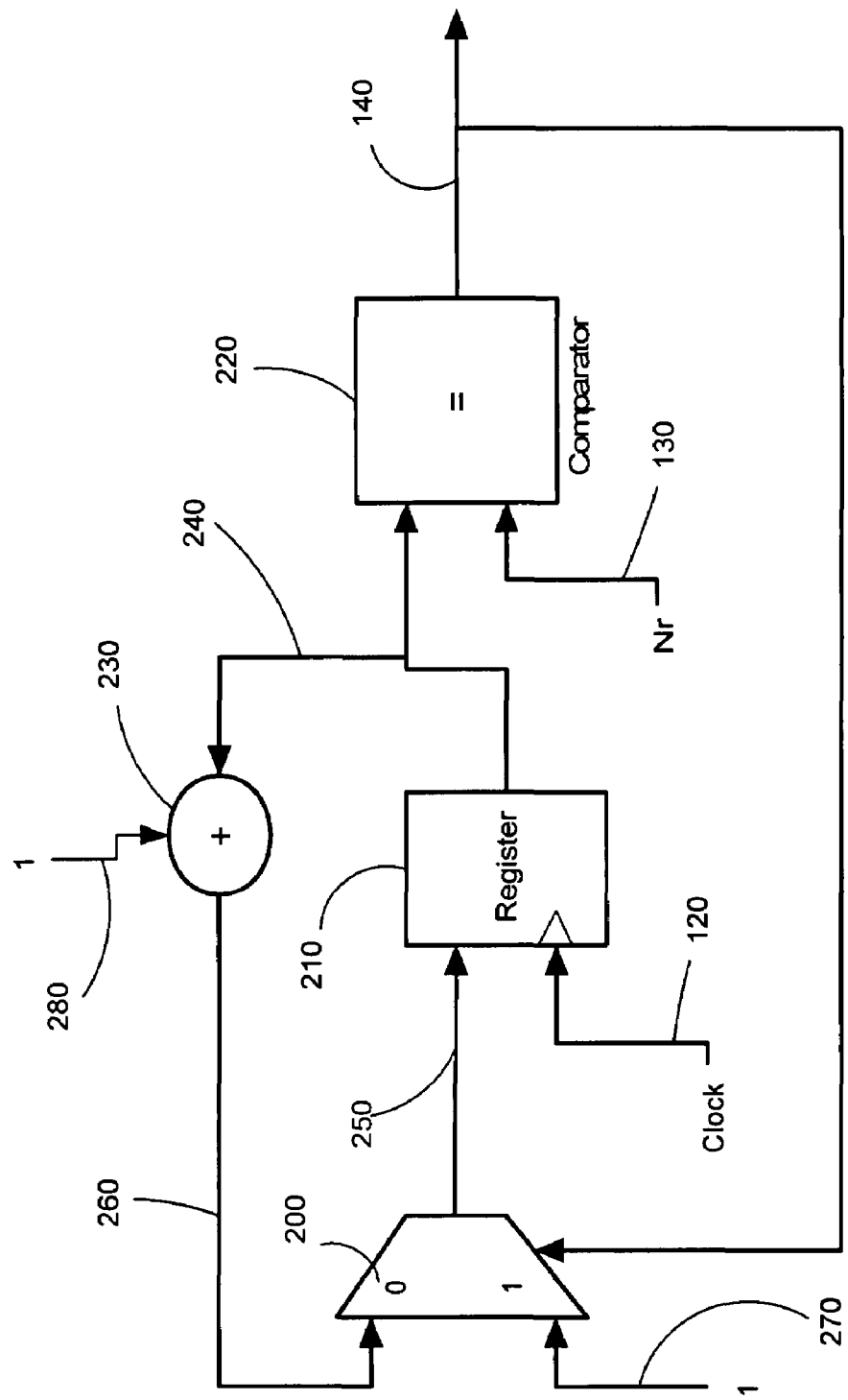
FIG. 3 a block diagram of a possible design of a reference counter block which may be used in one embodiment of the invention.

Referring to FIG. 3, a sample circuit which may be used for the reference counter block 110 is illustrated. The block diagram in FIG. 3 illustrates a divide-by-N circuit. Other types and configurations of divide-by-N circuits may be used in lieu of the circuit in FIG. 3.

The circuit in FIG. 3 has a multiplexer 200, a register 210, a comparator 220, and an adder 230. The output of the comparator 220 is the hit signal 140 that is the output of the reference counter block 110. This hit signal 140 is also a selector input to the multiplexer 200. The count output 240 of the register 210 is received by both the adder 230 and the comparator 220. The comparator 220 also receives as input the reference value 130. The output 250 of the multiplexer 200 is received as one of the inputs of the register. The register 210 is clocked by the reference clock signal 120. The multiplexer 200 receives as input the output 260 of the adder 230 and a constant value 270 (in one embodiment, this value is 1). The adder 230 receives as input a constant value 280 (in one embodiment, this value is 1) and the count output 240 of the register.

The circuit works by outputting a high value on the hit signal 140 whenever the value of the count output 240 equals the reference value 130. When this occurs, the output of the multiplexer 200 is taken as the constant value 270 (again, the value is 1 in one embodiment). This constant value is written to the register whenever the count signal 240 equals the reference value 130. The value of the count signal 240 is incremented by the adder 230. This incremented value is output as output 260 by the adder 230 and is stored in the register on the following clock cycle by virtue of being selected in the multiplexer by the resulting low value of the hit signal 140.

The circuit thereby effectively counts the clock pulses of the reference clock signal and, whenever the number of clock pulses reaches the value Nr, a hit signal is generated and the count is reinitialized.

Figure 4:
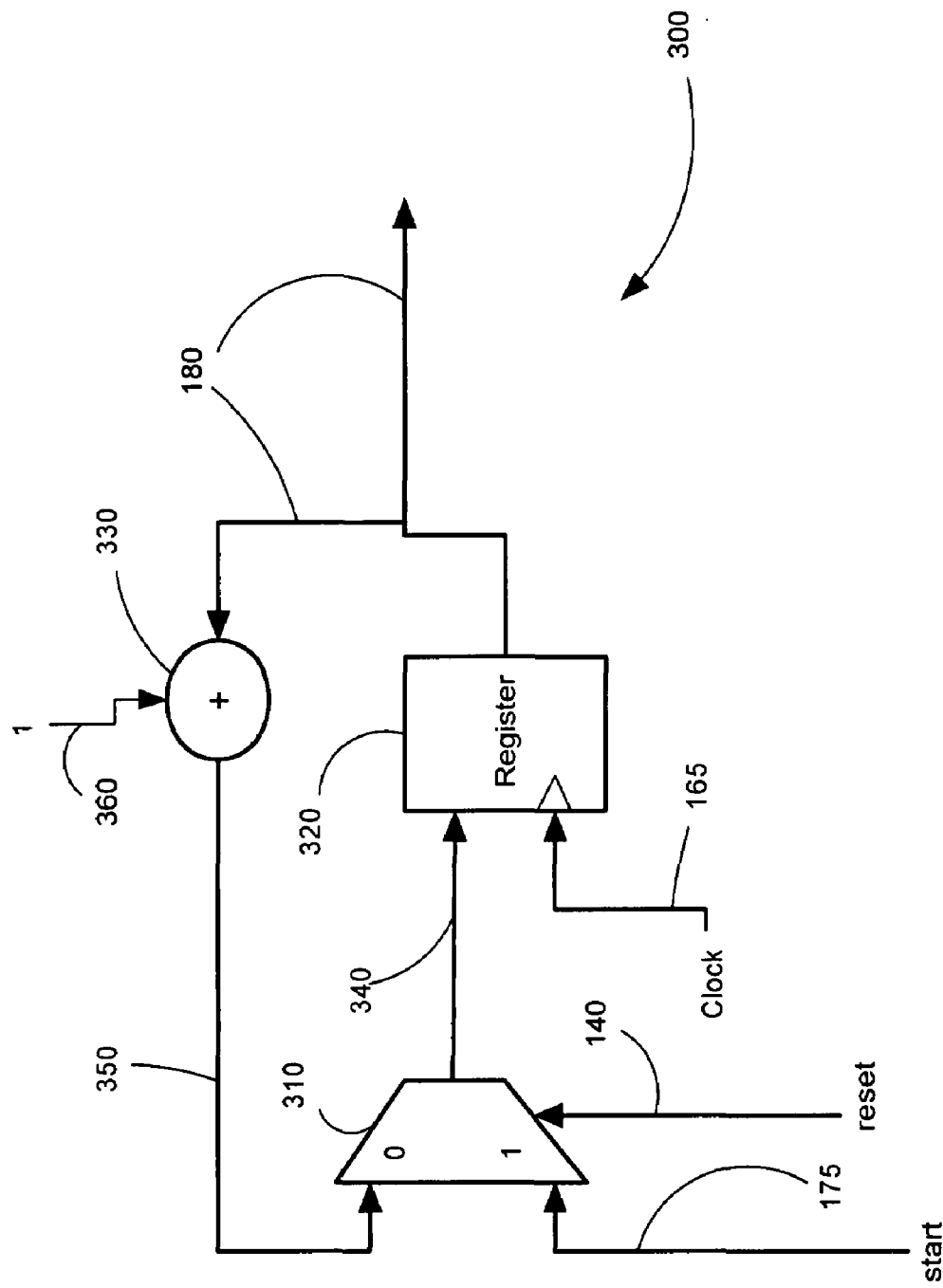
FIG. 4 illustrates a possible configuration of a feedback counter block which may be used with one embodiment of the invention.

Referring to FIG. 4, a sample circuit for the feedback counter block 150 is illustrated. The feedback counter 150 is, in essence, a resettable counter. The circuit in FIG. 4 is provided merely as an example of such a resettable counter. Other resetttable counter circuits may be used.

The resettable counter circuit 300 comprises a multiplexer 310, a register 320, and an adder 330. The output of the register 320 is the feedback count 180 while the inputs to the register are the local oscillator clock signal 165 and the output 340 of the multiplexer 310. The multiplexer 310 has 3 inputs—the hit signal 140 is the selector signal while the start value 175 and a count output 350 of the adder 330 provide the selections for the multiplexer 310. The adder 330 increments the feedback count 180 and receives a constant high value 360 (in one embodiment, this has a value of 1).

The circuit 300 counts the pulses of the local oscillator clock signal 165 and outputs this feedback count 180. When a hit signal 140 is received, the counter is reset to 1. A reset to zero or any other value may be used by using such a starting value on the start signal line.

Figure 5:
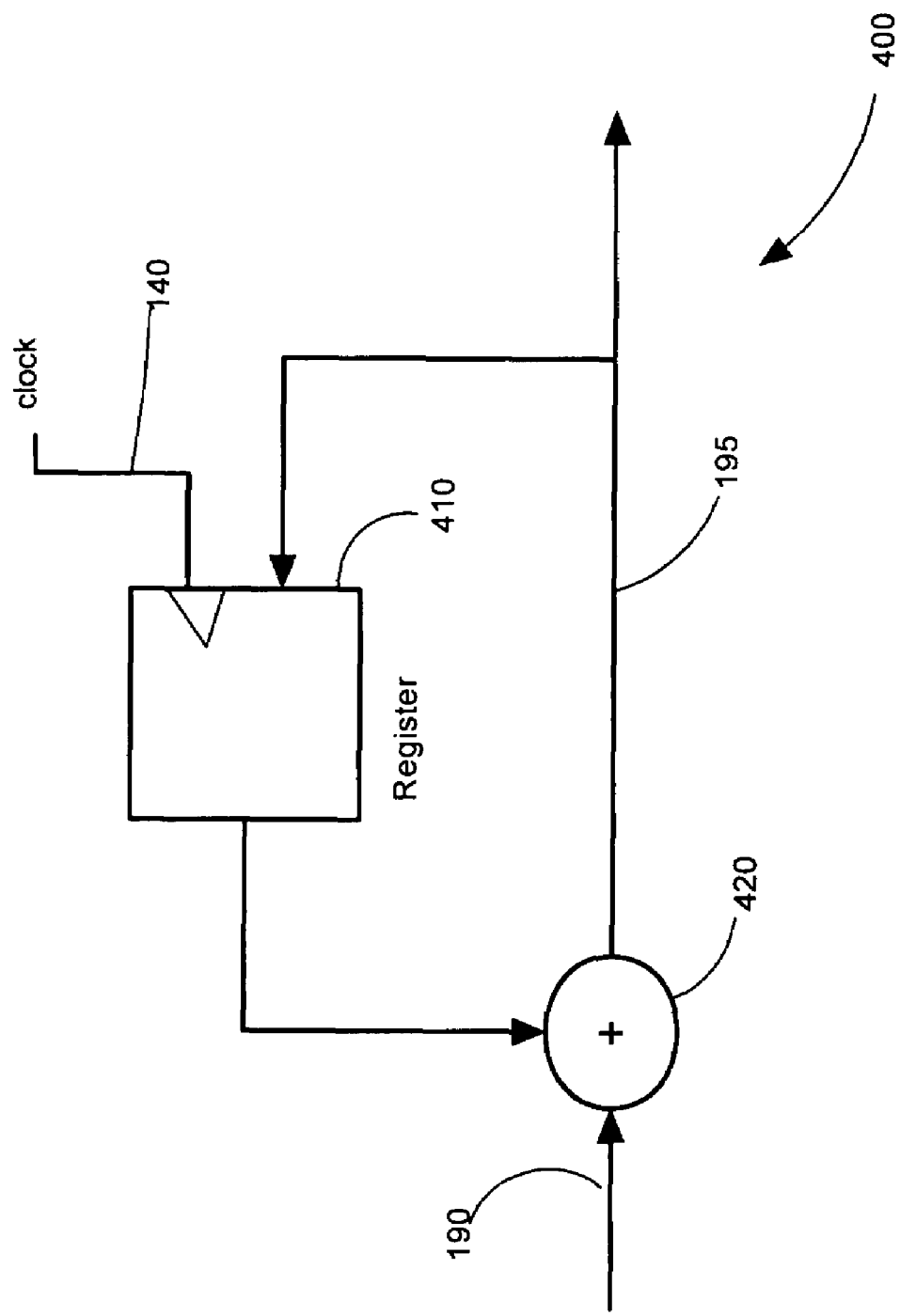
FIG. 5 illustrates a possible configuration of a controller block which may be used with an embodiment of the invention.

Referring to FIG. 5, a circuit 400 which may be used for the controller block 160 is illustrated. The circuit 400 receives the count error signal 190 from the adder 185. As noted above, the value of the counter error signal 190 is the difference between the feedback count value 180 and the feedback value 187. In the circuit 400, a register 410 is clocked by the hit signal 140. The register 410 receives, as input, the output 195 of an adder 420 that receives the count error signal 190. This output 195 of the adder 420 is the feedback adjust signal 195 in FIG. 2. The circuit 400, every time a hit signal is generated, therefore adds whatever value is in the register 410 to the error count signal value. Since the error count signal is a difference between the feedback value and the feedback count value, the feedback adjust signal is a cumulative tracking of the difference between the local oscillator frequency and the frequency of the reference clock signal. In one embodiment, if the local oscillator frequency is lower than the frequency of the reference clock signal, then the feedback adjust signal will be proportional to the difference between the two frequencies. The feedback adjust signal will therefore cause the local oscillator to increase its frequency by an amount related to the value of the feedback adjust signal. Similarly, if the local oscillator frequency is higher than the frequency of the reference clock signal, then the feedback adjust signal will cause the local oscillator to lower its frequency.

Figure 6:
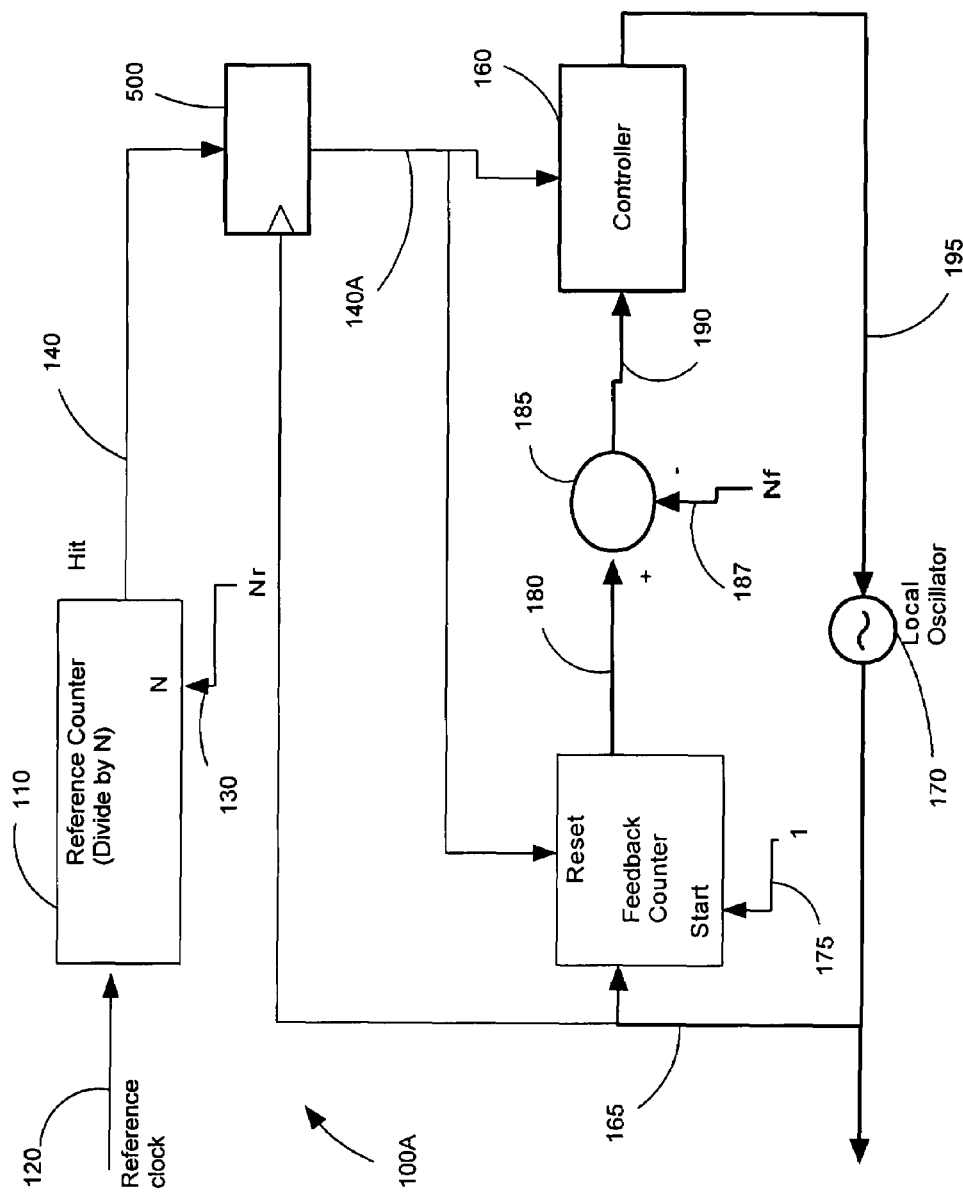
FIG. 6 illustrates another embodiment of the invention.

Referring to FIG. 6, another possible configuration of the system 100 is illustrated. The system 100A in FIG. 6 is similar to the system 100 in FIG. 2 with the exception that a metastable hardening block 500 has been added to the system 100 in FIG. 6. The hardening block 500 receives the hit signal 140 and outputs a modified hit signal 140A. The modified hit signal 140A is the reset and clock signal received by the controller block 160 and the feedback counter block 150. The hardening block 500 allows the hit signal to cross from one clock domain (the reference clock) to another (i.e. the local oscillator clock). The metastable hardening block 500 is not required for the basic system but it does ensure that the system works properly.

Figure 7:
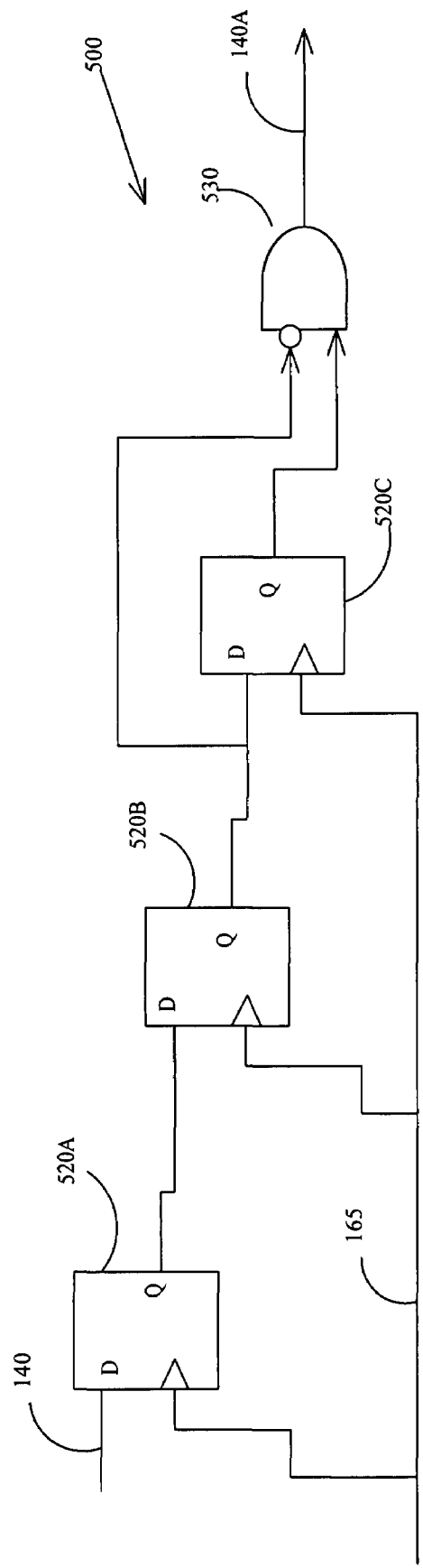
FIG. 7 is a block diagram of a possible configuration of a hardening block which may be used with the embodiment in FIG. 6.

Referring to FIG. 7, a block diagram of a possible hardening block 500 is illustrated. As can be seen, the hit signal 140 is received by one of three cascaded D flip flops 520A, 520B, 520C. D flip flop 520A receives the hit signal 140 and its output is received by D flip flop 520B. Similarly, D flip flop 520B has an output received by D flip flop 520C. However, the negative of the output of D flip flop 520B is also received by AND gate 530 along with the output of D flip flop 420C. The output of AND gate 530 is the modified hit signal 140A.

The first two D flip flops (520A, 520B) provide metastable hardening of the signal while the remainder of the circuit performs a negative edge detect function.

It should be noted that the three D flip flops 520A, 520B, 520C are all clocked by the local clock signal 165. It should further be noted that other designs may be used in the hardening block 500.

It should be clear that the determination of the value for the feedback value (Nf) and the reference hit value (Nr) determines when hit signals are generated and when and by how much the local clock signal's frequency is increased or decreased. Ideally, the values for Nr and Nf are related and are integers. Since it is assumed that the reference clock is a relatively constant train of pulses, we can define Tr as the nominal time period between reference clock pulses. Similarly, we can define Tx as the nominal time period of the local clock signal. The main relationship between Nf and Nr is given as:

$$Nf/Nr=Tr/Tx$$

Thus, it is further assumed that the nominal frequency of the reference clock is known as well as the nominal frequency of the local clock. The system merely allows the local clock to be frequency synchronized to be reference clock so that if the frequency of the reference clock drifts or changes slightly, the frequency of the local clock changes accordingly as well.

For implementations where the system synchronizes the local clock frequency with a wired or attached device (e.g. the reference clock is provided by an audio source coupled to the system), determining the values for Nr and Nf is simple, especially if the nominal local clock frequency is known. In one implementation, the nominal local clock frequency is 22.5792 MHz. For such an implementation, Nf=1 000 000 and Nr is given in the table below for specific values of the reference clock frequency:

| Reference clock frequency (MHz) | Nr value |
| --- | --- |
| 5.6448 | 250 000 |
| 8.4672 | 375 000 |
| 11.2896 | 500 000 |
| 16.9344 | 750 000 |
| 22.5792 | 1 000 000 |
| 1.4112 | 62 500 |
| 1.764 | 78 125 |
| 2.1168 | 93 750 |
| 2.8224 | 125 000 |

As noted above, the system may be used to synchronize clock signals over a wireless connection. Clearly, the receiver 40 would be attempting to synchronize its local clock frequency with the clock frequency of the transmitter 30 (see FIG. 1). For such an implementation, the transmitter 30 would be sending a constant stream of evenly spaced packets to the receiver 40. The rate at which the constant packets are received at the receiver 40 may be used as the reference clock for the instance of the system installed on the receiver 40.

Again, assuming a constant packet reception rate that is related to the remote clock frequency, it should be clear that the constant packet reception rate is related to the desired values for Nr and Nf. The inverse of the reception rate is the time period during which each packet is received. As such, this may be defined as Tr. If the nominal local clock frequency is known and if the nominal constant packet reception rate is known, the ration between Nf and Nr may then be found by using $$Nf/Nr=Tr/Tx$$

It should also be noted that, ideally, the period during which the packet is received is an integer multiple of the local clock frequency. As noted above, non-integer multiples may result in a small degree of drift for the circuit.

It should be noted that the terms "signal" and "value" in this document are mostly interchangeable as all values are represented using digital signals, and all signals can be interpreted as having integer values. Furthermore, the signals and values are either single bit or multi-bit. A person skilled in the art, using the principles provided above, will, depending on the implementation, understand which signals and which values are single bit or multi-bit.

Although various exemplary embodiments of the invention have been disclosed, it should be apparent to those skilled in the art that various changes and modifications can be made which will achieve some of the advantages of the invention without departing from the true scope of the invention.

A person understanding this invention may now conceive of alternative structures and embodiments or variations of the above all of which are intended to fall within the scope of the invention as defined in the claims that follow.

We claim:

1. A system for synchronizing a first frequency of a local clock signal with a second frequency of a reference clock signal, the system comprising:
   (a) a reference counter block comprising divide-by-N circuitry configured for successively dividing a number of received pulses of the reference clock signal by a value N equal to a predetermined reference value, and for successively producing therefrom a hit signal when the number of received pulses is the predetermined reference value;
   (b) a feedback counter block comprising resettable counter circuitry configured for receiving the local clock signal and the hit signals, for counting pulses of the local clock signal between successive received hit signals, and for producing a feedback count signal having a value corresponding to the count of the pulses of the local clock signal since the last hit signal;
   (c) adder circuitry configured for receiving the feedback count signal and a predetermined feedback value and for producing therefrom a count error signal representing the difference between the feedback count signal value and the predetermined feedback value; and
   (d) a controller block comprising circuitry configured for receiving the count error signal and the hit signals, the controller block being triggered by receipt of one of the hit signals, and producing a frequency adjust signal based on the count error signal, the frequency adjust signal being configured for use to synchronize the first frequency by increasing or decreasing the first frequency.

2. A system according to claim 1 wherein the controller block produces the frequency adjust signal by adjusting the frequency adjust signal by the count error signal each time one of the hit signals is received.

3. A system according to claim 1 wherein the divide-by-N circuitry receives the reference clock signal and increments a reference counter value upon receipt of each of the received pulses of the reference clock signal, wherein one of the successive hit signals is produced when the reference counter value equals a predetermined reference value and reinitializes the reference counter value.

4. A system according to claim 3 wherein the resettable counter circuitry increments the feedback count signal value upon receipt of each pulse of the local clock signal.

5. A system according to claim 3 wherein the predetermined reference value is related to the predetermined feedback value.

6. A system according to claim 5 wherein the predetermined reference value is related to the predetermined feedback value by the equation $$Nf/Nr = Tr/Tx$$

where

Nf is the predetermined feedback value

Nr is the predetermined reference value

Tr is a time period between pulses of the reference clock signal

Tx is a time period between pulses of the local clock signal.

7. A system according to claim 6 wherein the predetermined reference value and the predetermined feedback value are integers.

8. A system according to claim 1 wherein the reference clock signal is derived from a rate of reception of packets from a remote transmitter.

9. A system according to claim 8 wherein the packets are transmitted in a wireless manner by the transmitter.

10. A system according to claim 1, further comprising metastable hardening circuitry configured for receiving the hit signal and comprising front-end circuitry configured for hardening the received hit signal and back-end circuitry configured for performing a negative edge detect function, and for outputting a modified hit signal for receipt by the feedback counter block and the controller block instead of the hit signal, whereby the modified hit signal allows a cross between the clock domains of the reference and local clock signals.

11. A method for synchronizing frequencies between a reference clock signal having a first frequency and a local clock signal having a second frequency, the method comprising:
   (a) receiving the reference clock signal
   (b) incrementing a first counter value for every received pulse of the reference clock signal;
   (c) comparing the value of the first counter with a predetermined reference value;
   (d) in the event the value of the first counter equals the predetermined reference value, generating a hit signal and reinitializing the value of the first, and,
   concurrent with the previous steps, executing the following steps:
   (e) receiving said the local clock signal;
   (f) incrementing a second counter value for every received pulse of the local clock signal; and,
   in the event a hit signal is generated, executing the following steps:
   (g) receiving the value d of the second counter;
   (h) performing a comparison of the value of the second counter with a predetermined feedback value; (i) generating a frequency adjust signal based on said comparison;
   whereby the frequency adjust signal is configured for use for the synchronizing to increase or decrease the second frequency and the second counter is reset when the hit signal is generated.

12. A method according to claim 11 wherein said comparison is executed by subtracting said predetermined feedback value from said second counter value to result in a difference.

13. A method according to claim 12 wherein said frequency adjust signal is based on said difference.

14. A method according to claim 11 wherein said predetermined reference value is related to said predetermined feedback value.

15. A method according to claim 14 wherein said predetermined reference value is related to said predetermined feedback value by the equation $$Nf/Nr = Tr/Tx$$

where

Nf is the predetermined feedback value

Nr is the predetermined reference value

Tr is a nominal time period between pulses of said reference clock signal

Tx is a nominal time period between pulses of said local clock signal.

16. A method for synchronizing a first frequency of a local clock signal with a second frequency of a reference clock signal, the method comprising the steps:
  (a) dividing a number of received pulses of the reference clock signal by a value N equal to a predetermined reference value and producing a hit signal when the number of received pulses is the predetermined reference value;
  (b) receiving the local clock signal and the hit signal, counting pulses of the local clock signal between successive received hit signals, and producing a feedback count signal having a value corresponding to the count of pulses of the local clock since the last hit signal;
  (c) receiving the feedback count signal and a predetermined feedback value and for generating a count error signal representing the difference between the value of the feedback count signal and the predetermined feedback value; and,
  (d) upon generation of the hit signal, receiving the hit signal and the count error signal and producing a frequency adjust signal based on the count error signal, the frequency adjust signal being configured for use to synchronize the first frequency by increasing or decreasing the first frequency.

17. A method according to claim 16 whereby the dividing of the received pulses of the reference clock signal is performed by incrementing a reference counter value upon receipt of each pulse of the reference clock signal, the hit signal being produced when the reference counter value equals the predetermined reference value, and whereby the hit signal reinitializes the reference counter value.

18. A method according to claim 17 wherein the counting of pulses of the local clock signal between successive received hit signals in performed by incrementing a feedback counter value upon receipt of each pulse of the local clock signal.

19. A method according to claim 18 wherein the predetermined reference value is related to the predetermined feedback value by the equation $$Nf/Nr = Tr/Tx$$

where
  Nf is the predetermined feedback value
  Nr is the predetermined reference value
  Tr is a time period between pulses of the reference clock signal
  Tx is a time period between pulses of the local clock signal.

* * * * *